(12) United States Patent
Choi et al.

(10) Patent No.: US 9,035,191 B2
(45) Date of Patent: May 19, 2015

(54) PRINTED CIRCUIT BOARD AND METHOD FOR MANUFACTURING THE SAME

(71) Applicant: SAMSUNG ELECTRO-MECHANICS CO., LTD., Suwon (KR)

(72) Inventors: Woon Chul Choi, Suwon (KR); Hwan Soo Lee, Suwon (KR); Hye Yeon Cha, Suwon (KR)

(73) Assignee: SAMSUNG ELECTRO-MECHANICS CO., LTD., Suwon (KR)

( * ) Notice: Subject to any disclaimer, the term of this patent is extended or adjusted under 35 U.S.C. 154(b) by 38 days.

(21) Appl. No.: 13/826,771

(22) Filed: Mar. 14, 2013

(65) Prior Publication Data

US 2014/0151089 A1    Jun. 5, 2014

(30) Foreign Application Priority Data

Dec. 4, 2012    (KR) ........................ 10-2012-0139701

(51) Int. Cl.
*H05K 1/02* (2006.01)
*H05K 3/28* (2006.01)
*G03F 7/34* (2006.01)
*H05K 3/34* (2006.01)

(52) U.S. Cl.
CPC .. *G03F 7/34* (2013.01); *H05K 3/28* (2013.01); *H05K 1/0221* (2013.01); *H05K 3/281* (2013.01); *H05K 3/3452* (2013.01); *H05K 2203/0537* (2013.01); *H05K 2203/0594* (2013.01)

(58) Field of Classification Search
CPC . H05K 1/0221; H05K 3/0008; H05K 3/0064; H05K 3/28; H05K 3/281; H05K 3/285
See application file for complete search history.

(56) References Cited

U.S. PATENT DOCUMENTS

| | | | |
|---|---|---|---|
| 6,928,726 B2 * | 8/2005 | Zollo et al. | 29/832 |
| 2009/0078368 A1 * | 3/2009 | Nishimura et al. | 156/277 |
| 2010/0148361 A1 * | 6/2010 | Tsai | 257/737 |

FOREIGN PATENT DOCUMENTS

| | | |
|---|---|---|
| JP | 01-141904 | 6/1989 |
| JP | 2006-135151 | 5/2006 |
| KR | 10-2011-0029051 | 3/2011 |

* cited by examiner

*Primary Examiner* — Jeremy C Norris

(57) ABSTRACT

Disclosed herein are a printed circuit board, including: a substrate having a patterned circuit layer on one surface thereof; and a resist pattern having a pattern corresponding to the circuit layer and covering the circuit layer so as to close the circuit layer, wherein a width of the resist pattern covering an upper portion of the circuit layer is the same as that of the resist pattern covering a lower portion of the circuit layer, and a method for manufacturing the same.

11 Claims, 4 Drawing Sheets

- PRIOR ART -

PRINTED CIRCUIT BOARD AND METHOD FOR MANUFACTURING THE SAME

CROSS REFERENCE(S) TO RELATED APPLICATIONS

This application claims the benefit under 35 U.S.C. Section 119 of Korean Patent Application Serial No. 10-2012-0139701, entitled "Printed Circuit Board and Method for Manufacturing the Same" filed on Dec. 4, 2012, which is hereby incorporated by reference in its entirety into this application.

BACKGROUND OF THE INVENTION

1. Technical Field

The present invention relates to a printed circuit board and a method for manufacturing the same and more particularly, to a method for forming a resist layer protecting a circuit layer on a substrate having the circuit layer formed thereon.

2. Description of the Related Art

A printed circuit board (PCB), which is printed and formed with a line pattern, that is, a circuit layer on an electrical insulating substrate using a conductive material such as copper, is defined as a circuit board on which a mounted position of each electronic component is secured and the circuit layer connecting electronic components to each other is printed on a surface of the substrate and is fixed in order to densely mount many various kinds of electronic components on the substrate.

Examples of the printed circuit board include a single-sided printed circuit board in which the circuit layer is only formed on one surface of an insulating substrate, a double-sided printed circuit board in which the circuit layers are formed on both surfaces of the insulating substrate, and a multi-layer printed circuit board in which the circuit layers are formed as a multi-layer.

Meanwhile, the circuit layer disposed at an outmost layer of the printed circuit board is buried by a persistent protective film referred to as a resist and the resist is provided with a pattern corresponding to the circuit layer of the outmost layer. In order to accurately form the pattern on the resist, a resist layer method is widely used. Among others, resist layer methods of an alkali development type have mainly used in consideration of environmental issues or the like.

As one method of the resist layer methods, one-shot exposure method forming the pattern on a resist by first applying the resist onto the circuit layer and then by using a light from a lamp emitting an ultra violet ray has been widely known and has disclosed in Japanese Patent Laid-Open Publication No. Hei 01-141904, for example. In this collective exposure method, a photosensitive composition is applied onto a substrate and is dried, light from the lamp emitting the ultra violet ray is exposed onto the entire surface of the dried coating through a photomask, and development is then performed.

Meanwhile, the resist needs to have a thickness corresponding to the thickness of the circuit layer in order to insulate and protect the circuit layer. Therefore, in the case in which the thickness of the circuit layer is 100 μm or more, the thickness of the resist also needs to become 100 μm or more.

As described above, in the case in which the thickness of the resist is thick, the exposure and development conditions are needed to be intensified so as to be cured up to a lower portion of the resist in order to open the resist between the patterns of the circuit layer. However, due to the thick thickness of the resist, an upper portion of the resist is excessively cured and the lower portion thereof is relatively less cured. Therefore, as shown in FIG. 1, at the time of development, the lower portion of the resist 2 is over-developed, such that an undercut phenomenon occurs at the lower portion of the circuit layer 1. As a result, the lower portion of the circuit layer 1 is exposed.

In order to solve this problem, a method for applying thinner resist, exposing and developing the applied resist, and then repeating the above-mentioned processes several times to form one resist has been proposed. However, this method increases the number of processes in proportion to the times of laminating the resist, thereby degrading productivity and increasing processing cost. In addition, since the resist of the lowest layer is subjected to the phenomenon process in proportion to the times of laminating the resist, the lower portion of the circuit layer may be exposed similar to the related art.

RELATED ART DOCUMENT

Patent Document (Patent Document 1) Japanese Patent Laid-Open Publication No. Hei 01-141904

SUMMARY OF THE INVENTION

An object of the present invention is to provide a printed circuit board capable of covering all circuit layers without an undercut phenomenon using a simple method and a method for manufacturing the same.

According to an exemplary embodiment of the present invention, there is provided a printed circuit board, including: a substrate having a patterned circuit layer on one surface thereof; and a resist pattern having a pattern corresponding to the circuit layer and covering the circuit layer so as to close the circuit layer, wherein a width of the resist pattern covering an upper portion of the circuit layer is the same as that of the resist pattern covering a lower portion of the circuit layer.

According to another exemplary embodiment of the present invention, there is provided a method for manufacturing a printed circuit board, the method including: (a) preparing an insulating film in which a resist layer having a predetermined thickness is applied onto an upper surface of a base substrate; (b) patterning the resist layer according to a predetermined pattern to form a resist pattern; (c) preparing a substrate having a circuit layer formed thereon, disposing the resist pattern and the circuit layer so as to face each other, and then adhering the insulating film and the substrate to each other; and (d) separating the base substrate from the resist pattern.

The insulating film may be a dry film.

Step (b) may be performed through a photolithography process.

The resist layer may be semi-cured through a photocurable process at the time of exposure during the photolithography process.

The resist pattern may correspond to a pattern of the circuit layer.

After step (d), the resist pattern may completely be cured through a thermosetting process.

The thickness of the resist layer may be thicker than that of the circuit layer.

According to another exemplary embodiment of the present invention, there is provided a method for manufacturing a printed circuit board, the method including: (a) preparing an insulating film in which a resist layer having a predetermined thickness is applied onto an upper surface of a base substrate and processing a reference hole in a specific position of the insulating film; (b) patterning the resist layer according to a predetermined pattern to form a resist pattern; (c) preparing a substrate having a reference pin formed in a position corresponding to the reference hole and a circuit layer, disposing the resist pattern and the circuit layer so as to face each other, and then adhering the insulating film and the substrate to each other by coinciding the reference hole with the reference pin; and (d) removing the base substrate and the reference pin.

The number of reference pins provided on the substrate may be at least two.

The reference pin may be provided so as to be inserted into a hole formed in the substrate.

The reference pin may be provided on a plate and the plate may be closely adhered to a lower surface of the substrate, such that the reference pin may be inserted into the hole formed in the substrate.

DESCRIPTION OF THE PREFERRED EMBODIMENTS

Figure 1:
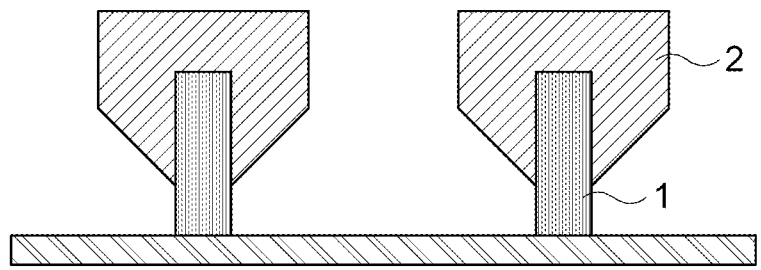
FIG. 1 is a view for describing a problem due to over-developing during a process of forming a resist layer according to the related art.

Various advantages and features of the present invention and methods accomplishing thereof will become apparent from the following description of embodiments with reference to the accompanying drawings. However, the present invention may be modified in many different forms and it should not be limited to the embodiments set forth herein. These embodiments may be provided so that this disclosure will be thorough and complete, and will fully convey the scope of the invention to those skilled in the art. Like reference numerals throughout the description denote like elements.

Terms used in the present specification are for explaining the embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

FIGS. 2 to 6 are process views sequentially showing a method for manufacturing a printed circuit board according to an exemplary embodiment of the present invention. Additionally, components shown in the accompanying drawings are not necessarily shown to scale. For example, sizes of some components shown in the accompanying drawings may be exaggerated as compared with other components in order to assist in the understanding of the exemplary embodiments of the present invention.

First, a finally completed printed circuit board according to the method for manufacturing the printed circuit board will be described with reference to FIG. 6. The printed circuit board according to the exemplary embodiment of the present invention includes a substrate 200 having a patterned circuit layer 210 formed on one surface thereof and a resist pattern 120a having a pattern corresponding to the circuit layer 210 and covering the circuit layer 210 so as to close the circuit layer 210.

In this configuration, a width of the resist pattern 120a covering an upper portion of the circuit layer 210 is the same as that of the resist pattern 120a covering a lower portion of the circuit layer 210. That is, the finally completed printed circuit board according to the method for manufacturing the printed circuit board according to the exemplary embodiment of the present invention may include the resist pattern 120a entirely and covering the circuit layer 210 so as to completely close the circuit layer 210 without an undercut phenomenon shown in FIG. 1.

Figure 2:
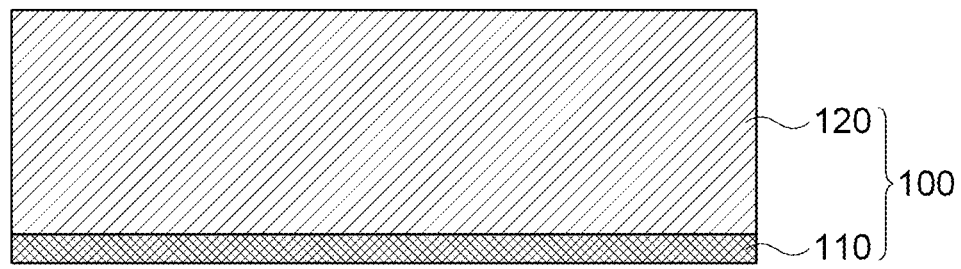
FIGS. 2 to 6 are process views sequentially showing a method for manufacturing a printed circuit board according to an exemplary embodiment of the present invention.

In order to manufacture the printed circuit board according to the exemplary embodiment of the present invention, first, an insulating film 100 in which a resist layer 120 having a predetermined thickness is applied onto an upper surface of a base substrate 110 is prepared, as shown in FIG. 2.

Here, the insulating film 100 may be a dry film including a dry-state (dry) resist layer 120. Although not shown in the drawings in order to describe only the gist of the present invention, a protective film may be adhered between the base substrate 110 and the resist layer 120. Since the resist layer 120 is not a liquid-state form but a dried form, the protective film made of polyester, polyethylene, or the like is removed when separating the base substrate 110 from the resist layer 120 in a subsequent process.

A resin configuring the resist layer 120 may use together a photocurable component and a thermosetting component so as to be cured by subsequent thermosetting and photocurable processes. For example, the resist layer 120 may include binder polymer such as an epoxy resin, a phenol resin, a silicone resin, an acryl resin, and the like, photo-reactive monomer, photo initiator, and other additives. Among them, the binder polymer plays an important role in maintaining the dry-state and has characteristics that development and delamination occur in a weak alkaline aqueous solution.

Meanwhile, since the resist layer 120 serves to insulate between patterns of the circuit layer and protect the circuit layer from the outside, the thickness of the resist layer 120 preferably is thicker than the thickness of the circuit layer adhered to the resist layer 120 in the subsequent process so that the resist layer 120 may cover all of the circuit layers.

Figure 3:
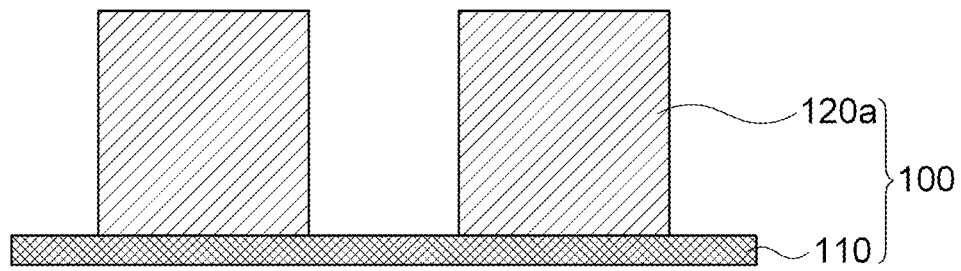

In the case in which the above-mentioned insulating film 100 is prepared, as shown in FIG. 3, the resist layer 120 is patterned to form the resist pattern 120a.

Since the resist layer 120 covers the circuit layer according to the pattern of the circuit layer to thereby insulate and protect the circuit layer, the resist pattern 120a may be formed so as to correspond to the pattern of the circuit layer.

The above-mentioned resist pattern 120a may be formed by employing a general photolithography process. That is, a photo mask (not shown) is disposed on the resist layer 120 and exposure and development processes are performed thereto, thereby forming the pattern on the resist layer 120. In this case, a negative method in which an un-exposed region is developed as well as a positive method in which an exposed region is not cured but dissolved and the un-exposed region is cured may be used.

Here, a photo-curing process is performed in the exposure process, thereby maintaining the resist layer 120 in a semi-cured state. As described above, since the resist layer 120 includes the photo initiator, in the case in which ultra violet UV is irradiated thereon in the state on which the photo mask is disposed, the exposed region other than the photo mask is semi-cured so as to become the resist pattern 120a through the subsequent development process.

Figure 4:
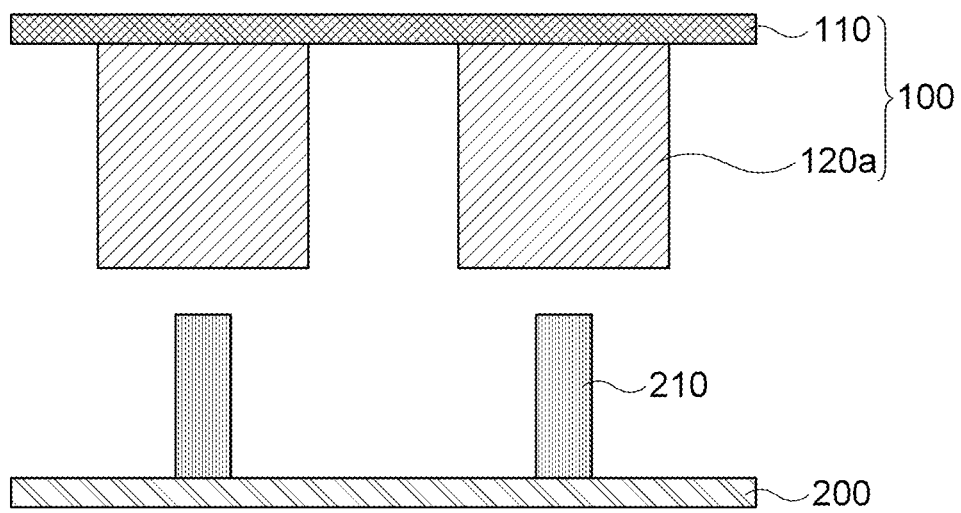

Next, a substrate 200 having a circuit layer 210 formed on one side or both side thereof is prepared. As shown in FIG. 4, the insulating film 100 is disposed so that the resist pattern 120a and the circuit layer 120 face each other and the insulating film 100 and the substrate 200 are then adhered to each other using a lamination roll or the like. In this configuration, the insulating film 100 and the substrate 200 are adhered to each other in the state in which the resist pattern 120a accurately corresponds on the pattern of the circuit layer 210.

Figure 5:
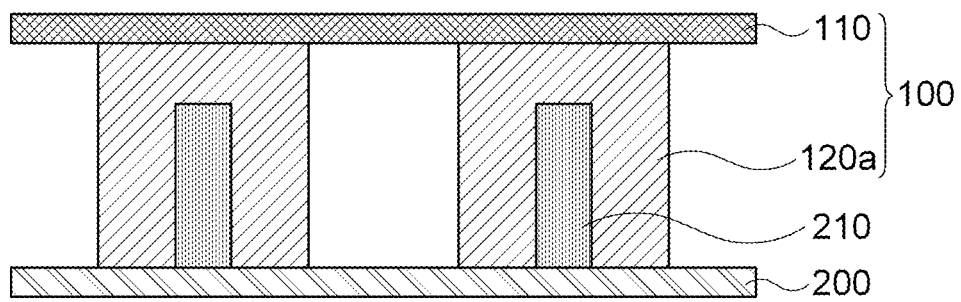

Since the resist pattern 120a corresponds to the pattern of the circuit layer 210 and the resist pattern 120a is in the semi-cured state by the previous photocurable process, in the case of adhering the insulating film 100 on the substrate 100, the circuit layer 210 is impregnated in the resist pattern 120a as shown in FIG. 5.

Figure 6:
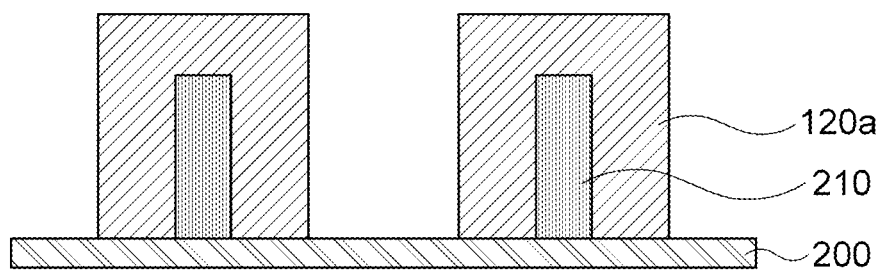

As described above, in the case in which the circuit layer 210 is impregnated in the resist pattern 120a, finally, as shown in FIG. 6, the base substrate 110 is separated from the resist pattern 120a and the thermosetting process is additionally performed, thereby completely curing the resist pattern 120a in the semi-cured state.

As described above, according to the exemplary embodiment of the present invention, the pattern is formed on the resist layer according to the pattern of the circuit layer in advance and the resist layer is directly adhered to the circuit layer, such that interference of light due to the circuit layer made of a metal at the time of exposure is not present and the front and back surfaces of the resist layer may be processed, unlike the related art, thereby making it possible to form the resist layer without the undercut phenomenon.

In addition, since the process is performed using only a single resist layer, the process is simplified, thereby making it possible to improve productivity of the product and decrease the processing cost.

Hereinafter, a method for manufacturing a printed circuit board according to another exemplary embodiment of the present invention will be described.

FIGS. 7 to 11 are process views sequentially showing a method for manufacturing a printed circuit board according to another exemplary embodiment of the present invention. For reference, like reference numerals in FIGS. 2 to 6 and FIGS. 7 to 11 denote like elements.

Figure 7:
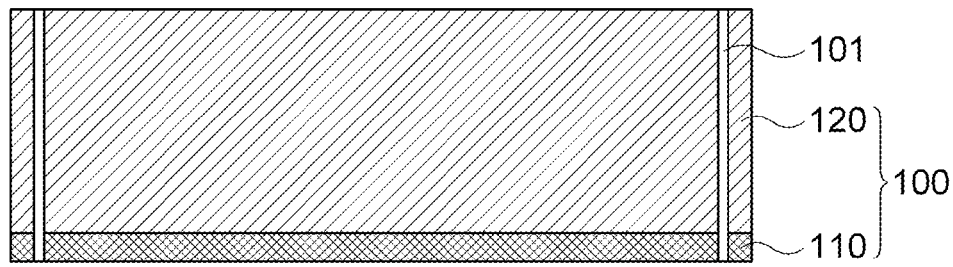
FIGS. 7 to 11 are process views sequentially showing a method for manufacturing a printed circuit board according to another exemplary embodiment of the present invention.

In the method for manufacturing the printed circuit board according to another exemplary embodiment of the present invention, first, the insulating film 100 in which the resist layer 120 having the predetermined thickness is applied onto the upper surface of the base substrate 110 is prepared and a reference hole 101 is processed in a specific position of the prepared insulating film 100, as shown in FIG. 7.

In this case, it is important that a diameter of the reference hole 101 is processed so as to be matched to a diameter of a reference pin to be described below and this process may be performed using a general known mechanical drill or a laser drilling such as $CO_2$ laser, YAG laser or the like. When the reference hole 101 is processed, it also penetrates through the base substrate 110.

Figure 8:
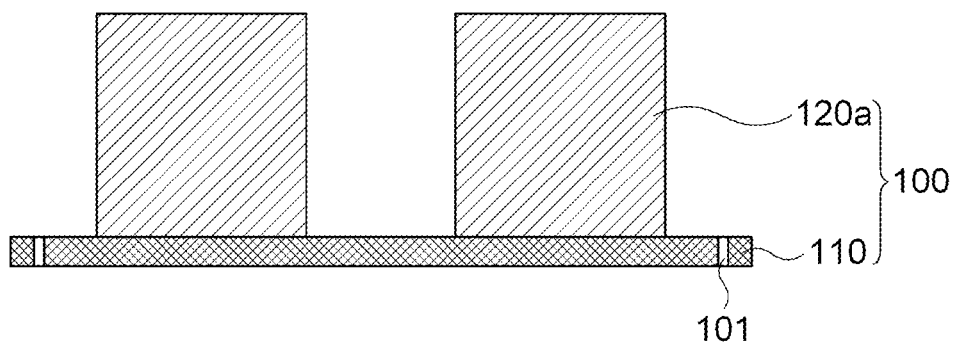

Next, as shown in FIG. 8, the resist layer is patterned according to a predetermined pattern to thereby form the resist pattern 120a. Since this may be performed through the photolithography process, a detailed description thereof will be omitted.

Figure 9:
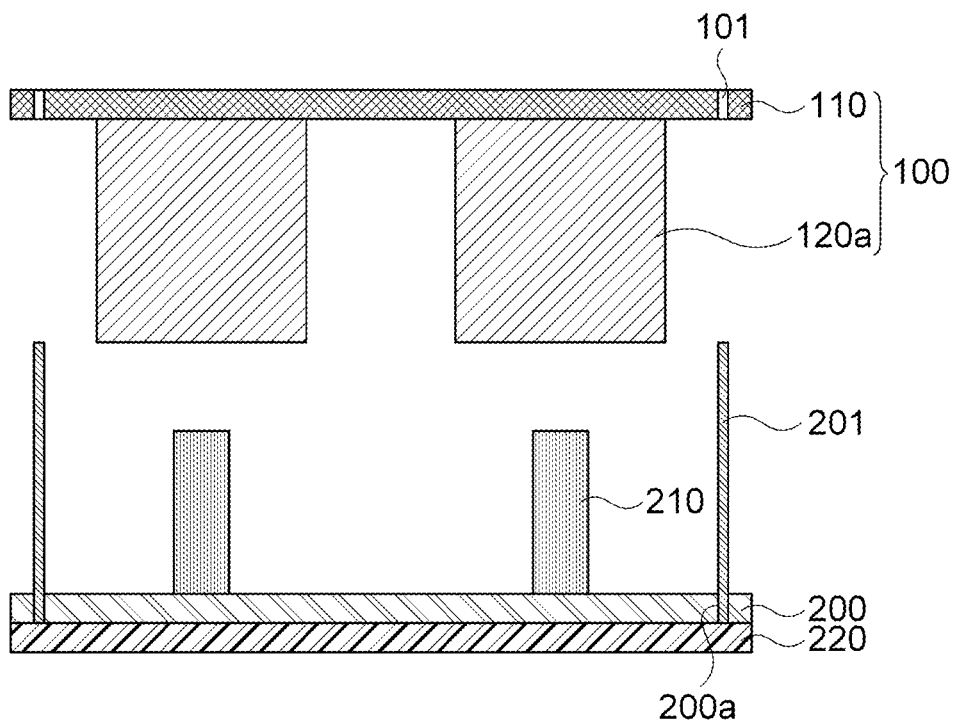

Next, a substrate 200 having the reference pin 201 formed at a position corresponding to the reference hole 201 and the circuit layer 210 formed thereon is prepared, as shown in FIG. 9, and the insulating film 100 is disposed so that the resist pattern 120a and the circuit layer 210 face each other and the insulating film 100 and the substrate 200 are then adhered to each other using the lamination roll or the like.

In this case, the reference hole 101 is coincided with the reference pin 201, such that the reference pin 201 is inserted into the reference hole 101. Therefore, in the method for manufacturing the printed circuit board according to another exemplary embodiment of the present invention, the resist pattern 120a and the pattern of the circuit layer 210 are aligned and adhered to each other.

At least two reference pins 201 may be preferably formed on the substrate 200, and more preferably, the reference pins 201 may be formed on each of left and right side portions of the substrate 200. Of course, in this case, a position and the number of the reference hole 101 are also formed so as to correspond to that of the reference pin 201.

The reference pin 201 may be formed so as to be inserted into a hole 200a penetrating through the substrate 200. More specifically, the reference pin 201 is provided on a predetermined plate 220 and the plate 220 is closely adhered to the lower surface of the substrate 200, thereby allowing the reference pin 201 to be inserted into the hole 200a.

In this case, the base substrate 110 is fixed to a clamp capable of pulling in an X-Y direction and the clamp is moved to displace the base substrate 110 in the X-Y direction, thereby making possible to allow the reference pin 201 to be inserted into the hole 200a.

Meanwhile, instead of using the reference pin 201, a matching target may be used. In this case, the base substrate 110 is made of transparent material and the clamp is displaced in the X-Y direction, thereby matching the resist pattern 120a with the pattern of the circuit layer 210.

Figure 10:
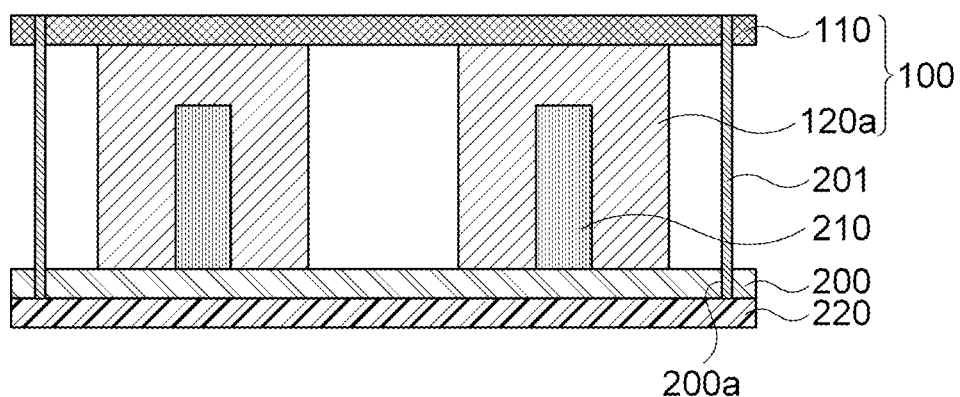

In the case in which the insulating film 100 and the substrate 200 are adhered to each other in the state in which the resist pattern 120a is matched with the pattern of the circuit layer 210, the circuit layer 210 is impregnated in the resist pattern 120a as shown in FIG. 10.

Figure 11:
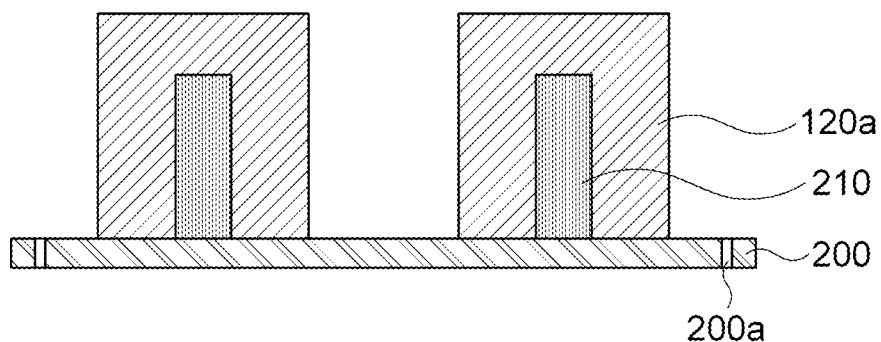

Finally, as shown in FIG. 11, the base substrate 110 and the reference pin 201 are removed, thereby completing the method for manufacturing the printed circuit board according to another exemplary embodiment of the present invention. The base substrate 110 may be removed by peeling-off the protective film between the base substrate 110 and the resist layer 120 and the reference pin 201 may be removed by separating the plate 220 from the substrate 200.

According to the method for manufacturing the printed circuit board according to the present invention, the pattern is formed on the resist layer according to the pattern of the circuit layer in advance and the resist layer is directly adhered to the circuit layer, such that interference of light due to the circuit layer made of a metal at the time of exposure is not present and the front and back surfaces of the resist layer may be processed, unlike the related art, thereby making it possible to form the resist layer without the undercut phenomenon.

In addition, since the process is performed using only a single resist layer, the process is simplified, thereby making it possible to improve productivity of the product and decrease the processing cost.

The above detailed description has illustrated the present invention. Although the exemplary embodiments of the present invention have been described, the present invention may be also used in various other combinations, modifications and environments. In other words, the present invention may be changed or modified within the range of concept of the invention disclosed in the specification, the range equivalent to the disclosure and/or the range of the technology or knowledge in the field to which the present invention pertains. The exemplary embodiments described above have been provided to explain the best state in carrying out the present invention. Therefore, they may be carried out in other states known to the field to which the present invention pertains in using other inventions such as the present invention and also be modified in various forms required in specific application fields and usages of the invention. Therefore, it is to be understood that the invention is not limited to the disclosed embodiments. It is to be understood that other embodiments are also included within the spirit and scope of the appended claims.

What is claimed is:

1. A printed circuit board, comprising:
    a substrate having a patterned circuit layer on one surface thereof; and
    a resist pattern having a pattern corresponding to the circuit layer and covering the circuit layer so as to close the circuit layer and, via an open area formed by the resist pattern, to partially expose the substrate's remaining surface area on which the circuit layer is not formed,
    wherein a width of a part of the resist pattern covering an upper portion of the circuit layer is the same as that of the resist pattern covering a lower portion of the circuit layer.

2. A method for manufacturing a printed circuit board, the method comprising:
    preparing an insulating film in which a resist layer having a predetermined thickness is applied onto an upper surface of a base substrate;
    patterning the resist layer according to a predetermined pattern to form a resist pattern, the predetermined pattern corresponding to a pattern of a circuit layer formed on a substrate;
    preparing the substrate having the circuit layer formed thereon, disposing the resist pattern and the circuit layer so as to face each other, and then adhering the insulating film and the substrate to each other; and
    separating the base substrate from the resist pattern, such that the resist pattern partially exposes the substrate's remaining surface area on which the circuit layer is not formed, via an open area formed by the resist pattern.

3. The method according to claim 2, wherein the insulating film is a dry film.

4. The method according to claim 2, wherein the patterning is performed through a photolithography process.

5. The method according to claim 4, wherein the resist layer is semi-cured through a photocurable process at the time of exposure during the photolithography process.

6. The method according to claim 2, wherein after the separating, the resist pattern is completely cured through a thermosetting process.

7. The method according to claim 2, wherein the thickness of the resist layer is thicker than that of the circuit layer.

8. A method for manufacturing a printed circuit board, the method comprising:
    preparing an insulating film in which a resist layer having a predetermined thickness is applied onto an upper surface of a base substrate and processing a reference hole in a specific position of the insulating film;
    patterning the resist layer according to a predetermined pattern to form a resist pattern, the predetermined pattern corresponding to a pattern of a circuit layer formed on a substrate;
    preparing the substrate having a reference pin formed in a position corresponding to the reference hole and the circuit layer, disposing the resist pattern and the circuit layer so as to face each other, and then adhering the insulating film and the substrate to each other by coinciding the reference hole with the reference pin; and
    removing the base substrate and the reference pin, such that the resist pattern partially exposes the substrate's remaining surface area on which the circuit layer is not formed, via an open area formed by the resist pattern.

9. The method according to claim 8, wherein the number of reference pins provided on the substrate is at least two.

10. The method according to claim 8, wherein the reference pin is provided so as to be inserted into a hole formed in the substrate.

11. The method according to claim 10, wherein the reference pin is provided on a plate and the plate is closely adhered to a lower surface of the substrate, such that the reference pin is inserted into the hole formed in the substrate.

* * * * *